United States Patent
Delabie et al.

(10) Patent No.: US 9,842,734 B2
(45) Date of Patent: Dec. 12, 2017

(54) METHOD OF FORMING A FEATURE OF A TARGET MATERIAL ON A SUBSTRATE

(71) Applicants: IMEC VZW, Leuven (BE); KATHOLIEKE UNIVERSITEIT LEUVEN, KU LEUVEN R&D, Leuven (BE)

(72) Inventors: Annelies Delabie, Bierbeek (BE); Markus Heyne, Leuven (BE)

(73) Assignees: IMEC VZW, Leuven (BE); Katholieke Universiteit Leuven, KU LEUVEN R&D, Leuven (BE)

( * ) Notice: Subject to any disclaimer, the term of this patent is extended or adjusted under 35 U.S.C. 154(b) by 0 days.

(21) Appl. No.: 15/378,849

(22) Filed: Dec. 14, 2016

(65) Prior Publication Data

US 2017/0178905 A1    Jun. 22, 2017

(30) Foreign Application Priority Data

Dec. 21, 2015    (EP) .................................... 15201632

(51) Int. Cl.
*H01L 21/02* (2006.01)

(52) U.S. Cl.
CPC .. *H01L 21/02645* (2013.01); *H01L 21/02568* (2013.01); *H01L 21/02603* (2013.01)

(58) Field of Classification Search
CPC ......... H01L 21/02645; H01L 21/02568; H01L 21/02603
See application file for complete search history.

(56) References Cited

U.S. PATENT DOCUMENTS

| | | | |
|---|---|---|---|
| 2005/0176228 A1* | 8/2005 | Fonash | B81C 1/0019 438/597 |
| 2008/0276979 A1* | 11/2008 | Lagally | H01L 29/0665 136/239 |
| 2013/0189837 A1* | 7/2013 | Haukka | C23C 16/0227 438/655 |

* cited by examiner

*Primary Examiner* — Karen Kusumakar
(74) *Attorney, Agent, or Firm* — McDonnell Boehnen Hulbert & Berghoff LLP (57) ABSTRACT

A method is provided for forming a feature of a target material on a substrate. The method including:
  forming a feature of a sacrificial material on the substrate; and
  forming the feature of the target material by a deposition process during which the feature of the sacrificial material is removed from the substrate by forming a volatile reaction product with a precursor of the deposition process, wherein the sacrificial material is replaced by the target material and the target material is selectively deposited on surface portions of the substrate, which portions were covered by the feature of the sacrificial material, to form the feature of the target material.

19 Claims, 4 Drawing Sheets

METHOD OF FORMING A FEATURE OF A TARGET MATERIAL ON A SUBSTRATE

CROSS-REFERENCE

This application claims priority from EP 15201632.5 filed Dec. 21, 2015, which is incorporated by reference in its entirety.

TECHNICAL FIELD

The present disclosure relates to a method of forming a feature of a target material on a substrate.

BACKGROUND

In semiconductor device manufacturing, forming features on the substrate is frequently required wherein the shape and dimension of the feature depends on the type of device that is to be manufactured. One standard technique for forming features involves patterning a material layer using, for instance a combination of lithography and etching. A drawback with this technique is however that the etchants may react with the material that is patterned in such a way that the electronic properties of the material are adversely affected at the edges of the features (i.e. the boundary surfaces of the features which are formed during the etching). This drawback may be more pronounced as device dimensions, and thus the dimensions of the features, are reduced.

SUMMARY OF THE DISCLOSURE

In view of the above, a general objective of the present disclosure is to provide an alternative technique of forming a feature of a target material on a substrate which does not present or at least reduces the drawbacks of conventional patterning techniques. Further objectives may be understood from the following:

According to an aspect of the present disclosure, there is provided a method of forming a feature of a target material on a substrate comprising:

forming a feature of a sacrificial material on the substrate; and forming the feature of the target material by a deposition process during which the feature of the sacrificial material is removed from the substrate by forming a volatile reaction product with a precursor of the deposition process, wherein the sacrificial material is replaced by the target material and the target material is selectively deposited on surface portions of the substrate, which portions were covered by the feature of the sacrificial material, to form the feature of the target material.

By the disclosed method, a selective deposition process is provided wherein a pattern of a sacrificial layer may be transferred to a target material. Thereby materials which otherwise may be challenging or not possible to process using conventional lithography and etching (e.g. due to not forming volatile compounds with the etchants) may be formed in features having a desired geometry by using the sacrificial layer as an intermediary or template. Also, by not relying on an etching process, a reaction between the target material and etchants may be avoided.

Typically, the sacrificial layer may be formed of a material which may be patterned using lithography.

The feature of the sacrificial material and the feature of the target material may also be referred to as a sacrificial feature and a target feature, respectively.

According to one embodiment, the sacrificial material can include a sacrificial element acting as a co-reagent in a reaction with the precursor of the deposition process.

The presence of the sacrificial material may accordingly be a condition for the reaction with the precursor, wherein it follows that the amount of the sacrificial element, determined inter alia by the dimensions of the feature of the sacrificial material, can control the final dimensions of the feature of the target material, at least partially. Thus, the patterning of the sacrificial layer can affect the position as well as the longitudinal, lateral and thickness dimensions of the feature of the target material. For instance, the co-reagent may function as a reducing agent or may participate in a ligand exchange reaction.

According to one embodiment, the precursor includes a compound of a target element, for forming the target material, and a reaction element, and the sacrificial material includes a sacrificial element acting as a co-reagent in a reaction with the precursor and forming a volatile reaction product with the reaction element wherein the target element is deposited on the substrate.

Thereby a target material composed of a single type of chemical element may be formed.

According to one embodiment, the deposition process includes exposing the substrate to a first precursor and a second precursor, the first precursor includes a compound of a first target element, for forming the target material, and a first reaction element, the sacrificial layer includes a sacrificial element acting as a co-reagent in a reaction with the first precursor and forming a volatile reaction product with the first reaction element wherein the first target element is deposited on the substrate; and the second precursor includes a compound of a second target element, for forming the target material in combination with the first target element, and a second reaction element wherein the second target element reacts with the first target element deposited on the substrate to form the target material and the second reaction element forms a volatile reaction product.

Thereby a target material composed of a combination of two types of chemical elements may be formed.

The deposition process in any of the above embodiments may be a chemical vapor deposition process, a pulsed chemical vapor deposition process or an atomic layer deposition process.

The precursor or precursors of the deposition process may be gaseous.

According to one embodiment, forming the feature of the sacrificial material on the substrate can include forming a sacrificial material layer on the substrate and patterning the sacrificial material layer using a lithography and etching process.

The sacrificial layer may thus be patterned using conventional and readily available patterning processes. The sacrificial layer may also be formed to include a number of monolayers in the range of 1-10.

According to one embodiment, the feature of the sacrificial material can include at least one nanostructure. The target material may thus be formed as a nanostructure feature.

According to one embodiment, the at least one nanostructure can include at least one nanowire extending along the substrate. The target material may thus be formed as a horizontal nanowire-feature. A nanostructure forming a nanowire may be understood as a nanostructure presenting an elongated shape. The width of the nanowire may for instance be 5-10 nm.

The nanostructure may also be formed in the shape of a quantum dot. A quantum dot shape may in this context be understood as a feature having a lateral extension which does not exceed 10 nm, and generally does not exceed 5 nm.

According to one embodiment, the feature of the sacrificial material can be formed on a buffer layer of the substrate which is inert to the precursor(s) of the deposition process. The buffer layer may hence prevent underlying materials from reacting with the precursors of the deposition process.

According to one embodiment, the sacrificial layer can include Si, Al, Ti, TiN, Hf, Sn, Zr, or Ta. Each of these materials has the ability to form a volatile reaction product with both chloride- and fluoride-based precursors. Processes for deposition and patterning of layers of these materials can be accurate and reliable.

According to one embodiment, the deposition process can include a precursor including a transition metal source. A target material feature including a transition metal may thereby be formed. In some embodiments, the precursor may include a compound of a transition metal and a fluoride or a chloride. The transition metal may be tungsten (W) or molybdenum (Mo).

A target material feature of a transition metal material may be converted to a feature of a transition metal dichalcogenide (TMDC) material by subjecting the target material feature to a sulfurization or selenization process.

According to one embodiment, the deposition process can include a first precursor including a transition metal source and a second precursor including a chalcogen source.

A target layer including a transition metal dichalcogenide (TMDC) may thereby be formed. By forming the TMDC using the first and second precursors, the target material feature may be by a stack of TMDC monolayers. A monolayer of a TMDC (which also may be denoted $MX_2$) can include a layer of transition metal atoms M sandwiched between two layers of chalcogen atoms X.

The disclosed method may be used for forming patterns of $MX_2$. Patterning $MX_2$ layers by conventional lithography methods may require combinations of etchants in different cycles due to the structure of the $MX_2$. Moreover, nanostructures of $MX_2$ layers made by conventional patterning and etching techniques may present unpassivated edges (unsaturated/"dangling" metal bonds, chalcogen-vacancies) or contain impurities/residues from the etch process. The structure of the $MX_2$ edges and the edge termination and the passivation of edge atoms can alter the electronic properties of $MX_2$ nanoclusters and make them prone to oxidation. The disclosed method can avoid these issues since the $MX_2$ may be deposited directly in features of the desired shape. In particular, the method enables forming of an essentially "2D" feature (i.e. a 2-dimensional layer or film) of the TMDC.

The transition metal of the first precursor may be tungsten (W) or molybdenum (Mo). The first precursor may be a compound of the transition metal and a fluoride or chloride. The chalcogen of the second precursor may be selenium (Se), sulfur (S) or tellurium (Te). The second precursor may be a compound of the chalcogen and hydrogen ($H_2$).

According to one embodiment, the feature of the sacrificial material is formed on a layer of $Al_2O_3$, a layer of $SiO_2$, a layer of $Si_3N_4$, a transition metal dichalcogenide layer, a graphene layer or a metal layer. These materials can be substantially inert with respect to reacting with the precursors or elements thereof during the deposition process. They can be especially inert to transition metal- and fluoride-/chloride based precursors.

According to one embodiment, the deposition process can include a first precursor and a second precursor, wherein the first precursor is selected from the group consisting of: $WF_6$, $MoCl_3$, $MoCl_4$, $MoCl_6$, $WCl_4$, $WCl_5$, $WCl_6$, $WO2Cl_2$, and wherein the second precursor is selected from the group consisting of: $H_2S$, $H_2Se$, $H_2Te$, $H_2O$, an $O_2$ plasma, $O_3$, $NH_3$, a C-based compound.

According to one embodiment, at least one discrete sacrificial material feature can be formed on the substrate (for instance by forming a sacrificial material layer on the substrate and patterning the sacrificial material layer to include at least one discrete sacrificial material feature) wherein each of the at least one feature, during the deposition process, can be replaced by a respective feature of the target material including one or more monolayers of a transition metal dichalcogenide material, the method further comprising:

subsequent to the deposition process, depositing the transition metal dichalcogenide material on an edge portion of each feature of the target material by performing a lateral deposition process wherein a lateral dimension of each feature of the target material is increased.

Thereby an essentially "2D" feature of the TMDC target material may be formed with an increased extension in the horizontal plane of the substrate. The sacrificial layer may be patterned to include a plurality of discrete sacrificial features spatially distributed on the substrate. The original feature(s) of the target material formed during the (first) deposition process can thereby act as a nucleation center(s) during the additional deposition process. The positions of the finally obtained features can be controlled by position of the discrete features. The lateral dimensions of the finally obtained features can be controlled by the lateral growth process.

An edge portion of a feature should in this context be understood as the vertically extending/laterally facing surface portion of the feature.

A lateral dimension of a feature should in this context be understood as the dimensions or the extension in the layer/crystal plane of the transition metal dichalcogenide material.

The transition metal dichalcogenide material forming the target feature during the (first) deposition process may be formed in accordance with the above embodiments, i.e. by the deposition process including a first precursor including a transition metal source and a second precursor including a chalcogen source.

The lateral deposition process may be a chemical vapor deposition process, a pulsed chemical vapor deposition process or an atomic layer deposition process. The lateral deposition process may include a first precursor including a transition metal source and a second precursor including a chalcogen source. The transmission metal source may include tungsten (W) or molybdenum (Mo). The chalcogen source may include selenium (Se), sulfur (S) or tellurium (Te).

Each feature of the sacrificial material may formed with a lateral extension not exceeding 10 nm, and generally not exceeding 5 nm. A thickness of each feature of the sacrificial material may correspond to a height of 1-10 monolayers of the $MX_2$ target material that is to be formed. Thus, the lateral dimensions of each feature of the sacrificial material, and consequently also of the target material, may be smaller than the dimensions of the crystals in polycrystalline $MX_2$ films obtained using conventional methods. This enables formation of mono-crystalline features of $MX_2$. By the lateral deposition process, the lateral extension of each $MX_2$ feature may be increased while the mono-crystalline properties are preserved.

According to one embodiment, the feature of the sacrificial material can be formed on a template layer of the substrate. The template layer may control the orientation of the growth fronts of the target material during the lateral deposition process.

According to one embodiment, the method further comprises, subsequent to the lateral deposition process, depositing an additional transition metal dichalcogenide, which can be different from the transition metal dichalcogenide of the target material, on an edge portion of the feature of the target material by performing an additional lateral deposition process. The lateral dimensions of the feature of the target material may thereby be further increased and a heterosystem including a first and a second transition metal dichalcogenide may be formed. The position(s) of each heterosystem can be determined by the position(s) of the discrete sacrificial feature(s).

The additional lateral deposition process may be a chemical vapor deposition process, a pulsed chemical vapor deposition process or an atomic layer deposition process. The additional deposition process may include a first precursor including a transition metal source and a second precursor including a chalcogen source. The transmission metal source may include tungsten (W) or molybdenum (Mo). The chalcogen source may include selenium (Se), sulfur (S) or tellurium (Te).

According to one embodiment, at least one discrete sacrificial material feature can be formed on the substrate (for instance by forming a sacrificial material layer on the substrate and patterning the sacrificial material layer to include at least one discrete sacrificial material feature) the method further comprising:

forming a set of mask portions on the substrate which are mutually separated such that a trench is formed between each pair of adjacent mask portions and each of the least one discrete sacrificial features is formed in a respective trench, wherein during the deposition process each discrete sacrificial material feature is replaced by a respective feature of the target material, wherein the target material includes one or more monolayers of a transition metal dichalcogenide, and the method further comprising:

subsequent to the deposition process, depositing an additional transition metal dichalcogenide material, which is different from the transition metal dichalcogenide of the target material, on an edge portion of each of the at least one feature of the target material by performing a lateral deposition process wherein a lateral dimension of each feature of the target material is increased.

Thus, a heterosystem may be formed of a first transition metal dichalcogenide a second transition metal dichalcogenide. This method may especially be used to form p-n junctions in a transition metal dichalcogenide material system.

The additional (second) transition metal dichalcogenide material may be formed on two opposite edge portions of the at least one feature of the target material. The first transition metal dichalcogenide material may hence be sandwiched between two features of the additional (second) transition metal dichalcogenide material.

The edge portion or edge portions on which the additional (second) transition metal dichalcogenide material can be deposited may be the edge portion or edge portions which are not facing towards a mask portion. That is, the edge portions which face along a trench.

The transition metal dichalcogenide material forming the target feature during the (first) deposition process may be formed in accordance with the above embodiments, i.e. by the deposition process including a first precursor including a transition metal source and a second precursor including a chalcogen source.

The lateral deposition process may be a chemical vapor deposition process, a pulsed chemical vapor deposition process or an atomic layer deposition process. The deposition process may include a first precursor including a transition metal source and a second precursor including a chalcogen source.

According to one embodiment the method can further comprise removing said set of mask portions subsequent to the additional lateral deposition process.

According to one embodiment at least one sacrificial feature of the sacrificial material can be formed as a nanowire on the substrate (for instance by forming a sacrificial material layer on the substrate and patterning the sacrificial material layer to include at least one nanowire) and the method can further comprise:

forming a support feature on the substrate, the support feature being formed to support at least one of the features of the target material; and subsequent to forming the at least one feature of the target material, removing material underlying the at least one feature of the target material wherein the at least one feature of the target material becomes suspended above a surface of the substrate by the support feature.

This enables formation of suspended nanowires of the target material. A nanowire may be understood as a nanostructure presenting an elongated shape. The width of the nanowire may be, for instance, 5-10 nm.

The support feature may be formed prior to forming the target material.

A respective support feature may be formed to support each of the at least one of the features of the target material.

A support feature may be formed to straddle each of the at least one nanowires. A respective support feature may be formed to straddle each of the at least one nanowires. During the deposition process at least the portion of the sacrificial material feature(s) which is exposed by the support feature(s) may be replaced by the target material.

The target material may include one or more monolayers of a transition metal dichalcogenide material. The transition metal dichalcogenide material forming each target feature may be formed in accordance with the above embodiments, i.e. by the deposition process including a first precursor including a transition metal source and a second precursor including a chalcogen source. The deposition process may include a first precursor including a transition metal source and a second precursor including a chalcogen source.

The support feature may be bonded to at least an end portion of the at least one target material feature prior to removing material underlying the target material. The method may further comprise, prior to removing the material underlying the target material, performing an annealing process such that the sacrificial material feature becomes bonded to the support feature.

BRIEF DESCRIPTION OF THE DRAWINGS

The above, as well as additional objects, features and advantages of the present disclosure, will be better understood through the following illustrative and non-limiting detailed description of embodiments of the present disclosure, with reference to the appended drawings. In the drawings like reference numerals will be used for like elements unless stated otherwise.

DETAILED DESCRIPTION OF THE DISCLOSURE

Figure 1A:
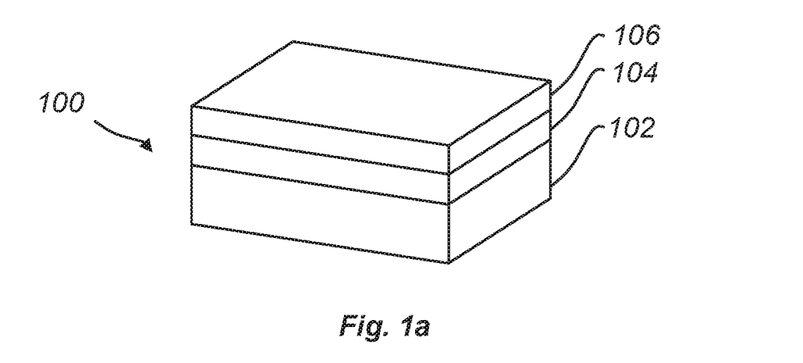
FIGS. 1a, 1b, and 1c schematically illustrate a method of forming a feature.
Figure 1B:
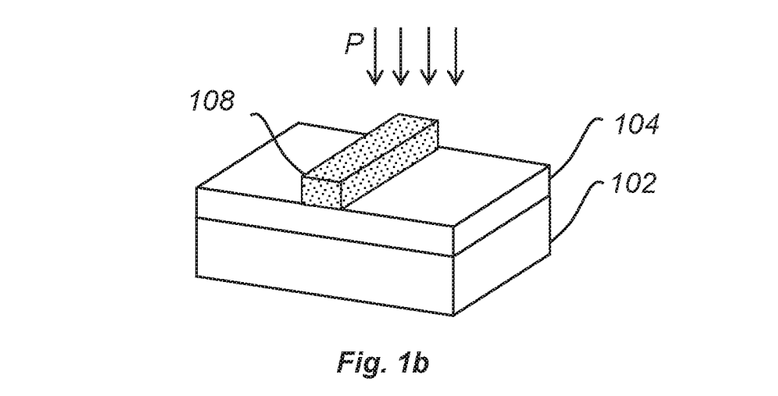
Figure 1C:
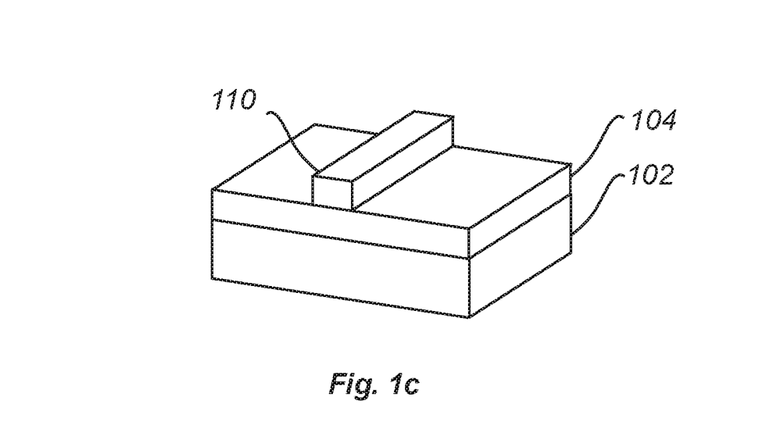

FIGS. 1a-c schematically illustrates a method of forming a feature 110 of a target material on a substrate 100.

FIG. 1a illustrates a stack of layers which in a bottom-up direction include a substrate layer 102, a buffer layer 104 and a sacrificial material layer 106. The substrate layer 102 and the buffer layer 104 form the substrate 100 on which the feature 110 will be formed, in accordance with the following.

It may be noted that FIG. 1a only shows a portion of the substrate 100 and that the substrate 100 may extend horizontally/laterally beyond the portion shown in FIG. 1a.

According to the method, the sacrificial material layer 106 can be patterned to form a feature of the sacrificial material 108 which is shown in FIG. 1b. The feature 108 may be formed by patterning the sacrificial material layer 106 using a lithography and etching process. The feature 108 may also be directly formed on the substrate 100 using an atomic layer deposition (ALD) process.

In FIG. 1b, the feature 108 forms an elongated nanostructure, such as a nanowire. However it is also possible to form more than feature 108, such as two or more nanowires distributed on the horizontally extending surface plane of the substrate 100. It is also possible to pattern the sacrificial material layer 106 to obtain other nanostructures such as a nanodot or a cluster of nanodots.

Subsequent to the forming of the feature 108, a deposition process can be performed. The deposition process, which will be disclosed in greater detail below, can include subjecting the substrate 100 and the feature 108 with one or more precursors, as schematically indicated by the reference sign P in FIG. 1b. During the deposition process, the feature 108 of the sacrificial material can be removed from the substrate 110 by forming a volatile reaction product with a precursor of the deposition process. Thereby, the feature 108 of the sacrificial material can be replaced by the target material which can be selectively deposited on the surface portion of the substrate 100 which, prior to the deposition process P, was covered by the feature 108 of the sacrificial material.

FIG. 1c shows the result of the deposition process wherein the feature 108 of the sacrificial material has been replaced by the feature 110 of the target material.

The sacrificial material can include a sacrificial element which acts as a co-reagent with a precursor of the deposition process P. The sacrificial element may function as a reducing agent in the reaction with the precursor. However, depending on the type of sacrificial element and precursor, it is, in principle, also possible that the sacrificial element functions as an oxidation agent with the precursor, or forms a co-reagent in a ligand exchange reaction.

Since the deposition process is such that the formation of the target material on the substrate 100 can involve a reaction between the sacrificial element and the precursor, the deposition process can become "self-limiting". In other words, when the feature 108 of the sacrificial material has been removed by reacting with the precursor, the formation of the feature 110 can stop. As a result, the feature 110 of the target material may be formed with dimensions which substantially correspond with the original dimensions of the feature 108 of the sacrificial material. The dimensions of the feature 108 may hence be "transferred" to the feature 110. For instance, a feature 108 having a thickness of 1-10 monolayers (of the sacrificial element) may be used to form a feature 110 in the target material with a corresponding thickness. The feature 110 may hence be formed as a 2D material feature.

The method described in connection with FIGS. 1a-c may be used to form a feature 110 of a target material including only a single chemical element. The deposition process may include exposing the substrate 100 with the feature 108 formed thereon to a single precursor P which includes a compound of a target chemical element and a reaction chemical element. The target chemical element can be the element of the precursor which can eventually form the feature 110 of the target material. The reaction chemical element can be the element of the precursor which can form a co-reagent with the sacrificial chemical element of the sacrificial material forming the feature 108. The sacrificial chemical element can react with the reaction chemical element to form a volatile reaction product. The feature 108 can thereby be removed from the substrate 100 during the reaction with the precursor and replaced by the feature 110 of the target chemical element in solid form.

The method described in connection with FIGS. 1a-c may be also used to form a feature 110 of a target material including a compound of a first and a second target chemical element. The deposition process may include exposing the substrate 100 with the feature 108 formed thereon to a combination of precursors P including a first precursor and a second precursor. The first precursor can include a compound of the first target chemical element and a first reaction chemical element. The second precursor can include a compound of the second target chemical element, and a second reaction chemical element.

The first target chemical element and the second target chemical element can be the elements which can eventually form the target material compound. The first reaction chemical element can be the element of the first precursor which can form a co-reagent with the sacrificial chemical element of the sacrificial material forming the feature 108.

The sacrificial chemical element can react with the first reaction chemical element to form a volatile reaction product. The sacrificial chemical element can thereby be removed from the substrate 100 during the reaction with the first precursor and replaced by the first target chemical element in solid form. The first target chemical element deposited on the substrate 100 can react with the second precursor to form a solid compound of the first and the second target chemical element, wherein the second reaction element of the second precursor can form a volatile reaction product. It should be noted that the removal of the sacrificial chemical element during the reaction with the first precursor may be gradual in the sense that a portion of the feature 108 of the sacrificial material can be removed during each cycle of the first precursor.

As illustrated in FIGS. 1a-c the substrate 100 may include the buffer layer 104, formed on the substrate layer 102. The buffer layer 104 can include a material which is inert to the precursor(s) P of the deposition process. The buffer layer 104 may hence prevent underlying materials from reacting with the precursors of the deposition process Different compositions of the substrate layer 102 are possible. For instance, the substrate layer 102 may be a silicon-based (Si) substrate such as a silicon on insulator (SOI) substrate. The substrate layer 102 may be a gallium arsenide substrate, a gallium arsenide phosphide substrate, an indium gallium arsenide substrate, a silicon germanium substrate, a silicon on glass substrate, a silicon on sapphire substrate or a germanium on insulator substrate. The buffer layer 104 may be formed by a layer of $Al_2O_3$, a layer of $SiO_2$, a layer of $Si_3N_4$, a transition metal dichalcogenide (TMDC) layer, a graphene layer or a metal layer.

The method described in connection with FIGS. 1a-c can be applicable to various material systems.

The method may be used to form the feature 110 of a target material including a transition metal. The deposition process may include exposing the substrate 100 with the feature 108 formed thereon to a precursor including a transition metal source, i.e. a transition metal element.

The precursor may include a compound of the transition metal element and a fluoride or a chloride. The sacrificial material may be formed by silicon (Si), aluminum (Al), titanium (Ti), titanium nitride (TiN), hafnium (Hf), tantalum (Ta), tin (Sn) or zirconium (Zr). Each of these materials can have the ability to form a volatile reaction product with chloride- or fluoride-based precursors. The sacrificial material may be an amorphous or crystalline material. The deposition process may be a (pulsed) chemical vapor deposition (CVD) process.

A feature 110 of tungsten (W) may be formed by subjecting a feature 108 formed by Si, Al, Ti or, TiN to the precursor compound $WF_6$ during the deposition process. For instance, a CVD process may be performed in a reaction chamber at a pressure falling in the range of 100-500 Pa. An ambient temperature in the reaction chamber may be 100-550° C. The precursor compound may be introduced at a flow rate of 10-700 standard cubic centimeters per minute (SCCM).

A feature 110 of W may alternatively be formed by Sn, Ti, Zr, Hf, Al or Ta by subjecting a feature 108 to the precursor compound $WCl_4$, $WCl_5$, $WCl_6$ or $WO_2Cl_2$ during the deposition process. For instance, a CVD process may be performed with similar process parameters as in the preceding example.

A feature 110 of molybdenum (Mo) may be formed by subjecting a feature 108 formed by Sn, Ti, Zr, Hf, Al or Ta to the precursor compound $MoCl_3$, $MoCl_4$ or $MoCl_5$ during the deposition process. For instance, a CVD process may be performed with similar process parameters as in the preceding example.

A feature of a transition metal, such as W or Mo, formed according to the above may be converted to a feature of a transition metal dichalcogenide (TMDC) having the chemical formula $MX_2$ (such as $WS_2$, $WSe_2$, $MoS_2$ or $MoSe_2$) by a sulfurization or selenization process. Conventional sulfurization and selenization processes are available. However, in the present context, for the purpose of obtaining a feature of $MX_2$ having good electrical properties, the process may be performed at a temperature of at least 450° C., at least 700° C., or at a temperature falling in the range of 800 to 1000° C.

The method described in connection with FIGS. 1a-c may also be used to directly form the feature 110 of a target material including $MX_2$.

The deposition process may include exposing the substrate 100 with the feature 108 formed thereon to a first precursor including a transition metal source/element and a second precursor including a chalcogen source/element.

The first precursor may include a compound of a transition metal element and a fluoride or chloride. The second precursor may include a compound of a chalcogen element and hydrogen $H_2$. The sacrificial material may be formed by Si, Al, Ti, TiN, Hf, Sn, Zr, or Ta. Each of these materials can have the ability to form a volatile reaction product with chloride- or fluoride-based precursors. The sacrificial material may be an amorphous or crystalline material. The deposition process may be an ALD process or a (pulsed) chemical vapor deposition (CVD) process.

A feature 110 of $WS_2$ may be formed by subjecting a feature 108 formed by Si, Al, Ti, TiN or Hf to a first precursor compound $WF_6$ and a second precursor compound $H_2S$. In the case of a sacrificial material formed by Si, the $WS_2$ material can be formed in a two-stage reaction process:

$$2WF_6^{(g)}+3Si^{(s)}\rightarrow 2W^{(s)}+3SiF_4^{(g)} \qquad (1)$$

$$W^{(s)}+2H_2S^{(g)}\rightarrow WS_2^{(s)}+2H_2^{(g)} \qquad (2)$$

The reaction process may be described in a corresponding manner in the case of a sacrificial material formed by Al, Ti, TiN or Hf (i.e. by replacing the occurrences of Si in the reaction formulas with Al, Ti, TiN or Hf). In any case the temperature in the reaction chamber may approximately fall in the range 400-450° C.

A feature 110 of $WS_2$ may also be formed by subjecting a feature 108 formed by Sn, Ti, Zr, Hf, Al or Ta to a first precursor compound of $WCl_4$, $WCl_5$, $WCl_6$ or $WO_2Cl_2$ and to a second precursor compound $H_2S$.

A feature 110 of $WSe_2$ may be formed by subjecting a feature 108 formed by Si, Al, Ti, TiN or Hf to a first precursor compound of $WF_6$ and a second precursor compound of $H_2Se$.

A feature 110 of $WSe_2$ may also be formed by subjecting a feature 108 formed by Sn, Ti, Zr, Hf, Al or Ta to a first precursor compound of $WCl_4$, $WCl_5$, $WCl_6$ or $WO_2Cl_2$ and a second precursor compound of $H_2Se$.

A feature 110 of WTe2 may be formed by subjecting a feature 108 formed by Si, Al, Ti, TiN or Hf to a first precursor compound of $WF_6$ and a second precursor compound of $H_2Te$.

A feature 110 of WTe2 may also be formed by subjecting a feature 108 formed by Sn, Ti, Zr, Hf, Al or Ta to a first precursor compound of $WCl_4$, $WCl_5$, $WCl_6$ or $WO_2Cl_2$ and a second precursor compound of $H_2Te$.

A feature 110 of $MoS_2$ may be formed by subjecting a feature 108 formed by Sn, Ti, Zr, Hf, Al or Ta to a first precursor compound of $MoCl_3$, $MoCl_4$ or $MoCl_5$ and to a second precursor compound $H_2S$.

A feature 110 of $MoSe_2$ may be formed by subjecting a feature 108 formed by Sn, Ti, Zr, Hf, Al or Ta to a first precursor compound of $MoCl_3$, $MoCl_4$ or $MoCl_5$ and to a second precursor compound $H_2Se$.

A feature 110 of $MoTe_2$ may be formed by subjecting a feature 108 formed by Sn, Ti, Zr, Hf, Al or Ta to a first precursor compound of $MoCl_3$, $MoCl_4$ or $MoCl_5$ and to a second precursor compound $H_2Te$.

The method described in connection with FIGS. 1a-c may also be used to form the feature 110 of a target material including other types of compounds than TMDCs:

A feature 110 of tungsten nitride (WN) may be formed by subjecting a feature 108 formed by Si, Al, Ti, TiN or Hf to a first precursor compound of $WF_6$ and a second precursor compound of $NH_3$.

A feature 110 of WN may also be formed by subjecting a feature 108 formed by Sn, Ti, Zr, Hf, Al or Ta to a first precursor compound of $WCl_4$, $WCl_5$, $WCl_6$ or $WO_2Cl_2$ and a second precursor compound of $NH_3$.

A feature 110 of tungsten carbide (WC) may be formed by subjecting a feature 108 formed by Si, Al, Ti, TiN or Hf to a first precursor compound of $WF_6$ and a second precursor compound including carbon (C).

A feature 110 of WC may also be formed by subjecting a feature 108 formed by Sn, Ti, Zr, Hf, Al or Ta to a first precursor compound of $WCl_4$, $WCl_5$, $WCl_6$ or $WO_2Cl_2$ and a second precursor compound including C.

A feature 110 of tungsten oxide ($WO_x$) may be formed by subjecting a feature 108 formed by Si, Al, Ti, TiN or Hf to a first precursor compound of $WF_6$ and a second precursor compound of $H_2O$, an $O_3$ plasma or an $O_2$ plasma.

A feature 110 of molybdenum oxide ($MoO_x$) may be formed by subjecting a feature 108 formed by Sn, Ti, Zr, Hf, Al or Ta to a first precursor compound of $MoCl_3$, $MoCl_4$ or $MoCl_5$ and to a second precursor compound of $H_2O$, an $O_3$ plasma or an $O_2$ plasma.

A feature 110 of molybdenum nitride (MoN) may be formed by subjecting a feature 108 formed by Sn, Ti, Zr, Hf, Al or Ta to a first precursor compound of $MoCl_3$, $MoCl_4$ or $MoCl_5$ and to a second precursor compound of $NH_3$.

A feature 110 of molybdenum carbide (MoC) may be formed by subjecting a from chloride precursor feature 108 formed by Sn, Ti, Zr, Hf, Al or Ta to a first precursor compound of $MoCl_3$, $MoCl_4$ or $MoCl_5$ and to a second precursor compound including C.

Figure 2A:
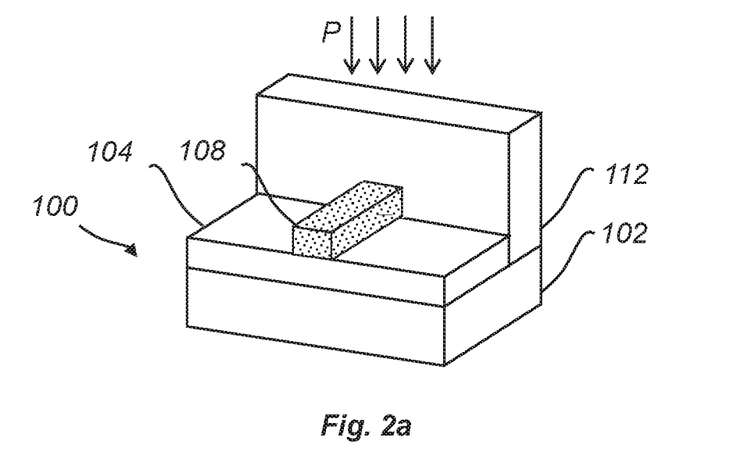
FIGS. 2a, 2b, and 2c schematically illustrate a method of forming a suspended feature.
Figure 2B:
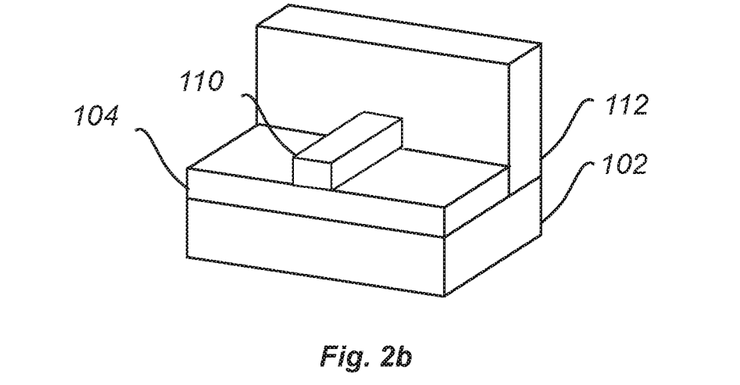
Figure 2C:
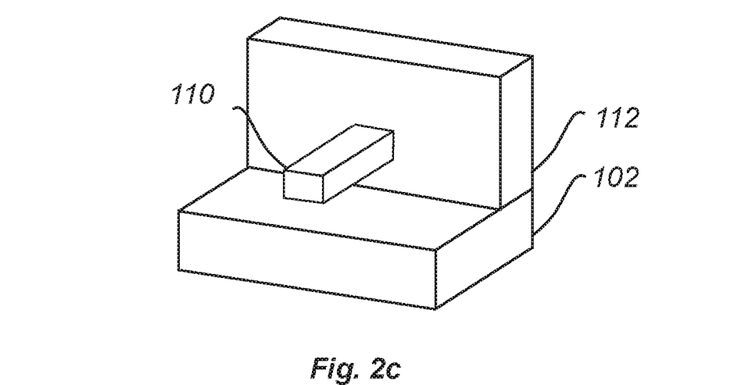

FIGS. 2a-c schematically illustrate a method for forming a feature 110 of a target material to be suspended above a horizontal surface of the substrate 110. The process can have a general applicability to the various combinations sacrificial material and target material discussed above. The process in FIGS. 2a-c may however be particularly useful for forming a suspended feature 110 of an $MX_2$ material, given their favorable electrical properties in terms of manufacturing power efficient semiconductor devices. For instance the feature 110 may be formed of $WS_2$, $WSe_2$, $WTe_2$, $MoS_2$, $MoSe_2$ or $MoTe_2$, using the above disclosed combinations of the sacrificial material, the target material and the first and the second precursors.

FIG. 2a illustrates the feature 108 of the sacrificial material formed on the buffer layer 104 of the substrate 100. The feature 108 may be formed in a same manner as discussed in connection with FIGS. 1a-c above.

A support feature 112 can be formed on the substrate layer 102. The support feature 112 can be formed at an end portion of the feature 108. Alternatively, the support feature 112 may straddle the feature 108. In that case the feature 108 may even extend beyond the support feature 112 to protrude laterally on two opposite sides of the support feature 112. In any case, a second support feature corresponding to the support feature 112 (not shown in FIGS. 2a-c) may be formed at the opposite end portion of the feature 108 wherein the suspended feature 110 which is to be formed may be supported at both ends thereof.

In analogy with the method discussed in connection with FIGS. 1a-c, a deposition process can be performed wherein the sacrificial material forming the feature 108 can be replaced by the target material forming the feature 110. In case the support feature 112 straddles the feature 108, the sacrificial material of the support feature 108 which is covered by the support feature 112 may be completely or partially replaced by the target material.

FIG. 2b shows the feature 110 formed on the buffer layer 104 with the support feature 112 formed at the end portion of the target feature 110. The support feature 112 can be formed to support the feature 110. For this purpose, the support feature 112 may be bonded to the end portion of the feature 110 prior removing material of the substrate 100 underlying the feature 110. The bonding may be achieved by performing an annealing process such that a chemical bond can be formed at the interface between the feature 110 and support feature 112. Subsequent to forming the feature 110, the buffer layer 104 can be selectively removed from the substrate layer 102. The support feature 112, however, can support the feature 110 which thus can become suspended above a horizontal surface of the substrate layer 102.

The buffer layer 104 may be removed in an etching process. Generally, the buffer layer 104 may be removed in an etching process which can be adapted to etch the buffer layer 104 at a higher rate than the material of the support feature 112, the target material of the feature 110 and the material of the substrate layer 102.

The buffer layer 104 may be formed by a layer of $Al_2O_3$, a layer of $SiO_2$, a layer of $Si_3N_4$, TMDC layer, a graphene layer or a metal layer. The support feature 112 may be formed by a different material than the buffer layer 104 and which allows the buffer layer 104 to be selectively removed from the substrate layer 102 without removing the support feature 112. If the buffer layer 104 is formed of $SiO_2$, (which for instance may be formed in an plasma enhanced CVD process) and the support feature 112 is formed of crystallized $Al_2O_3$ or $Si_3N_4$ of sufficient density, the buffer layer 104 may be selectively removed from the substrate layer 102 using an HF-based etchant.

In the event that the substrate 100 includes no buffer layer 104, the feature 110 may be formed directly on the substrate layer 102. In that case, the suspension of the feature 110 may be provided by reducing a thickness of the substrate layer 102 after the feature 110 has been formed thereon by removing material of the substrate layer 102 beneath the feature 110. This may be achieved for example by etching the substrate layer 102 until a desired thickness, and thus a desired vertical separation between the feature and the surface of the substrate layer 102 has been obtained.

Figure 3A:
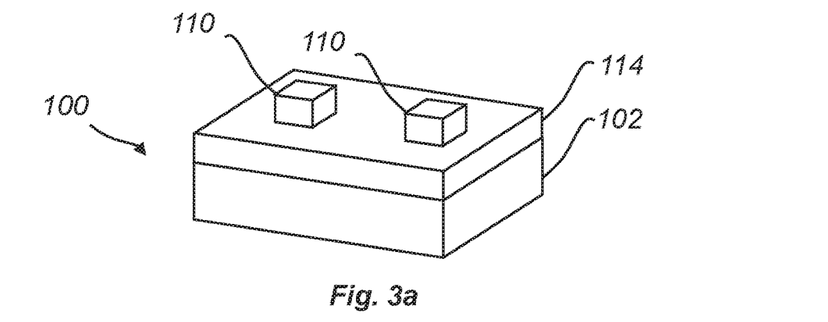
FIGS. 3a, 3b, 3c, and 3d schematically illustrate a method of forming a feature of a transition metal dichalcogenide material and a heterojunction feature including two transition metal dichalcogenide materials.
Figure 3B:
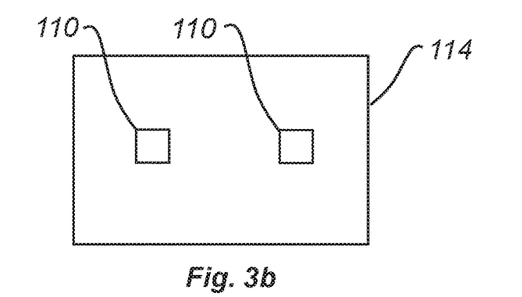
Figure 3C:
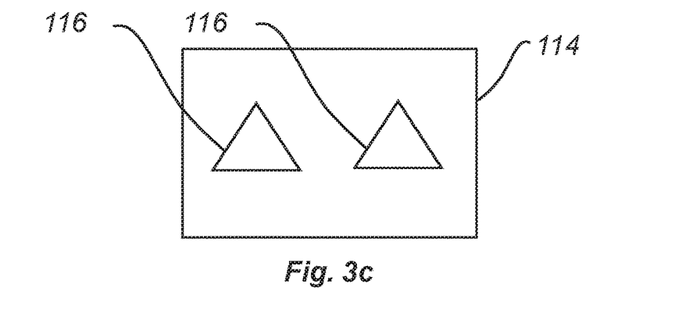

FIGS. 3a-c illustrates a method for forming a feature of the target material with an increased, and in principle arbitrary, lateral extension. The process can have a general applicability to the various combinations sacrificial material and target material discussed above. The process in FIGS. 3a-c may, however, be particularly useful for forming a feature 110 of an $MX_2$ material, given their favorable electrical properties in terms of manufacturing power efficient semiconductor devices. For instance, the feature 110 may be formed of $WS_2$, $WSe_2$, $WTe_2$, $MoS_2$, $MoSe_2$ or $MoTe_2$, using the above disclosed combinations of the sacrificial material, the target material and the first and the second precursors.

FIGS. 3a and 3b show in a perspective view and a top view, respectively, a substrate 100 with two discrete features 110 formed thereon, spatially distributed in relation to each other. The method is, however, not limited to two such features 110 but can be equally applicable to a smaller or greater number of such features 110.

The features 110 (which may be characterized as a "nano dot") may be formed using the method described in connection with FIGS. 1a-c, e.g. by patterning the sacrificial material layer 106 to include the desired number of discrete structures which can be subsequently replaced by respective features 110 of the target material.

The dimensions of each feature of the sacrificial material may be controlled such that the dimensions of the feature of the target material can become smaller than the dimensions of the crystals in polycrystalline $MX_2$ films obtained using conventional methods. This enables formation of monocrystalline features of $MX_2$. The sacrificial material layer 106 may for instance be patterned to include the desired number of features, each having a thickness of 1-10 monolayers of the sacrificial material and a lateral extension of 5-10 nm. Each feature of the sacrificial material may thereby be used to form a respective feature in the target material of corresponding dimensions. The features 110 may be characterized as a two-dimensional feature including one or more monolayers of $MX_2$.

The features of the sacrificial material may be formed on a template layer 114, wherein also the features 110 may be formed on the template layer 114. The function of template layer 114 can be to control the orientation of the growth fronts during the lateral sidegrowth process described below. The template layer 114 can be formed such that there can be a crystallographic relationship between the crystal structure of material forming the template layer 114 and the crystal structure of features 110. The template layer 114 may, for example, be formed by sapphire, GaN, AlN, Graphene, or a thin layer of an $MX_2$ material which can be different from the material forming the features 110. If control of the growth front is not needed, the sacrificial layer 114 may be omitted wherein the features 110 may be formed directly on the substrate layer 102 or on a buffer layer 104, if such is present.

Subsequent to the deposition process wherein the features 110 are formed on the substrate 100, a lateral deposition process can be performed on the substrate 100. The lateral deposition process can include depositing the $MX_2$ material forming the features 110 on edge portions (i.e. vertical surface portions) of the features 110. As illustrated in FIG. 3c, the result of the lateral growth process is that the lateral dimensions of the features 110 can be increased to form the enlarged $MX_2$ features 116. The original features 110 formed during the first deposition process may thereby act as nucleation centers during the lateral growth process. In FIG. 3c, the features 116 are by way of example shown with a triangular shape. However more generally, the features 116 may assume other shapes depending inter alia on the initial shape of the features 110 and/or the crystal structure of the $MX_2$ material. The latter factor may bear increasing weight as the lateral dimensions of the features 110 are reduced.

The lateral growth process may include a first precursor including a transition metal source (M) and a second precursor including a chalcogen source (X). The precursors used in the lateral growth process can result in a deposition of the $MX_2$ material which can be limited substantially to the vertical surfaces of the features 110. Put differently, the lateral growth rate can be greater than a vertical growth rate on the features 110. This selectivity can be a consequence of inter alia the more reactive nature of the crystal edges as compared to the basal planes of $MX_2$. Therefore, limiting a partial pressure of the transition metal source precursor (to obtain a low deposition rate) can result in a substantially lateral deposition of the $MX_2$ material on the features 110.

As an example, $MoS_2$ may be grown laterally on features 110 of $MoS_2$ in a deposition process including the vapor phase precursors $MoO_3$ and S. An ambient temperature in the reaction chamber may be 650° C. $MoS_2$ may also be grown in a CVD process including the precursors $Mo(CO)_6$, $(C_2H_5)_2S$ and $H_2$. An ambient temperature in the reaction chamber may be 550° C. $WS_2$ may be grown laterally on features 110 of $WS_2$ in a CVD process including the precursors $W(CO)_6$, $(C_2H_5)_2S$ and $H_2$. An ambient temperature in the reaction chamber may also in this case be 550° C.

Figure 3D:
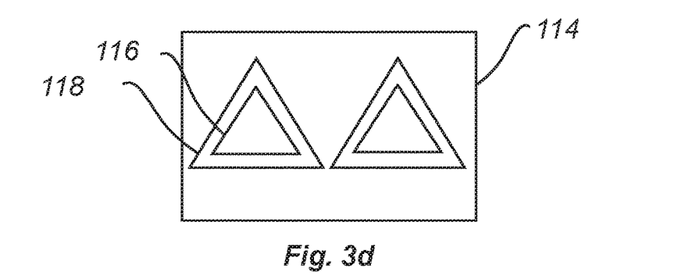

FIG. 3d, illustrates an extension of the process shown in FIGS. 3a-c. According to this extension, subsequent to the lateral deposition process of the $MX_2$ material on the sides of the features 110 to form the enlarged features 116, an additional $MX_2$ material can be grown on the vertical surface portions of the features 116 by performing an additional lateral deposition process. As illustrated in FIG. 3d, the result of the additional lateral growth process is that the lateral dimensions of the features 116 can be increased to form the enlarged $MX_2$ features 118.

This additional lateral deposition process can be similar to the first lateral deposition process but differs in that the deposited $MX_2$ material can be different from the first $MX_2$ material. The $MX_2$ material forming the features 116 may be denoted $MX_2^A$. The $MX_2$ material forming the features 118 may be denoted $MX_2^B$. Hence the features 118 include a heterosystem of $MX_2^A$ and $MX_2^B$.

Figure 4A:
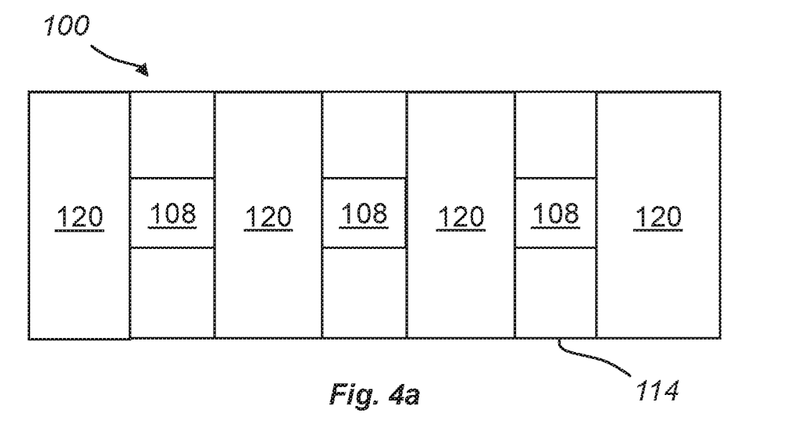
FIGS. 4a, 4b, and 4c schematically illustrate a method of forming heterojunction features including two transition metal dichalcogenide materials.
Figure 4B:
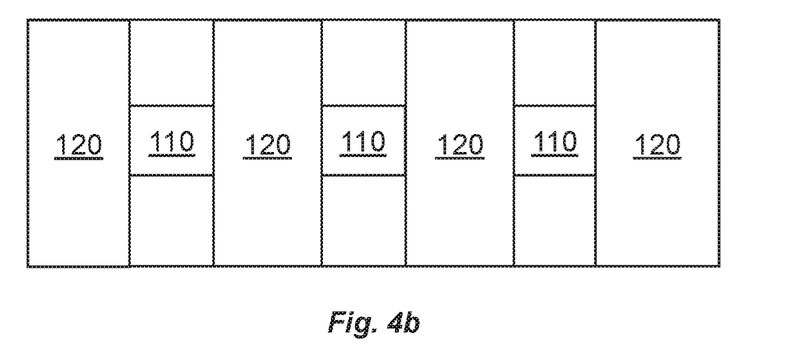
Figure 4C:
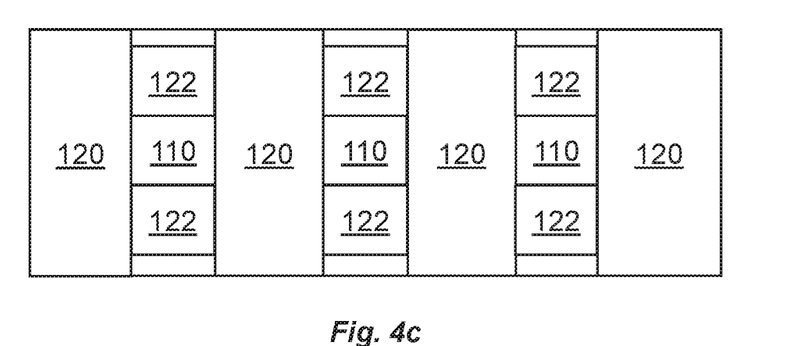

FIGS. 4a-c illustrate a method for forming a heterosystem which may be used for forming a heterostructure semiconductor device. The process has a general applicability to the various combinations sacrificial material and target material discussed above. The process in FIGS. 4a-c may, however, be particularly useful for forming $MX_2$ heterosystems, given their favorable electrical properties in terms of manufacturing power efficient semiconductor devices. For instance, the features 110 may be formed of a first $MX_2$ material (which may be denoted $MX_2^A$) and the features 122 may be formed of a second $MX_2$ material (which may be denoted as $MX_2^B$), wherein $MX_2^A$ and $MX_2^B$ may be selected from the group consisting of: $WS_2$, $WSe_2$, $WTe_2$, $MoS_2$, $MoSe_2$ and $MoTe_2$.

FIG. 4a is a top view of a substrate 100 on which a number of discrete features 108 of a sacrificial material is formed. The features 108 may be formed using the method described in connection with FIG. 1a including patterning the sacrificial material layer 106 to include the desired number of features 108 of the sacrificial material. As discussed in connection with FIG. 3a, the features 108 (e.g. "nanoclusters") may be formed by patterning the sacrificial material layer 106 to include the desired number of features, each having a thickness of 1-10 monolayers of the sacrificial material and a lateral extension of 5-10 nm.

Similar to the method described in connection with FIGS. 3a-c, the features 108 of the sacrificial material may optionally be formed on a template layer 114.

The method further includes formation of a set of mask portions 120 on the substrate 100 which are mutually separated such that a trench can be formed between each pair of adjacent mask portions. The mask portions 120 can be aligned with the features 108 such that each feature 108 can be arranged in a respective trench. The mask portions 120 may for example be formed by $Al_2O_3$, $Si_3N_4$, $SiO_2$, $ZrO_2$, $HfO_2$ or hBN.

With reference to FIG. 4b, and in analogy with the above described methods, the features 108 can be subsequently replaced by features 110 of the target material $MX_2^A$. Each feature 110 may be characterized as a two-dimensional nanocluster including one or more monolayers of $MX_2^A$.

Subsequent to the deposition process wherein the features 110 are formed on the substrate 100, a lateral growth process can be performed on the substrate 100. The lateral growth process can include growing layers of the $MX_2^B$ material on vertical surface portions of the features 110. Due to the mask portions 120, the lateral growth can occur on the vertical surface portions of each feature 110 which are exposed, i.e. not covered by a mask portion.

As illustrated in FIG. 4c, the result of the lateral growth process can be that each set of features 122/110/122 forms a heterosystem of $MX_2^B/MX_2^A/MX_2^B$ in the trenches between the mask portions 120.

Optionally, the mask portions 120 may be removed subsequent to growing the $MX_2^B$ features 122. The mask portions may be removed by selective etching thereof. For instance if the mask portions 120 are formed of amorphous $Al_2O_3$, the mask portions 120 may be removed using an HF-based etchant or a suitable liquid solvent.

For example, a feature 122 of MoS2 may be grown on features $WS_2$ in a same manner as described in connection with FIGS. 3c and 3d.

As an alternative to forming the set of mask portions 120 subsequent to the sacrificial features 108 and prior to the $MX_2^A$ features 110, the mask portions 120 may be formed subsequent to forming the $MX_2^A$ features 110 and prior to forming the $MX_2^B$ features 122.

As yet another alternative, the set of mask portions 120 may be formed on the substrate 100 prior to forming the sacrificial material layer on the substrate. Sacrificial material layer portions may hence be formed on surface portions of the substrate 100 which are exposed by the mask portions 120. The features 108 may subsequently be formed by patterning the sacrificial material layer portions in the trenches.

In the above, the disclosure has mainly been described with reference to a limited number of examples. However, as is readily appreciated by a person skilled in the art, other examples than the ones disclosed above are equally possible within the scope of the disclosure, as defined by the appended claims.

The invention claimed is:

1. A method of forming a feature of a target material on a substrate comprising:
   forming a feature of a sacrificial material on the substrate; and
   forming the feature of the target material by a deposition process during which the feature of the sacrificial material is removed from the substrate by forming a volatile reaction product with a precursor of the deposition process,
   wherein the sacrificial material is replaced by the target material and the target material is selectively deposited on surface portions of the substrate, which portions were covered by the feature of the sacrificial material, to form the feature of the target material, and
   wherein the deposition process includes exposing the substrate to a first precursor and a second precursor,
   the first precursor includes a compound of a first target element, for forming the target material, and a first reaction element,
   the sacrificial layer includes a sacrificial element acting as a co-reagent in a reaction with the first precursor and forming a volatile reaction product with the first reaction element wherein the first target element is deposited on the substrate; and
   the second precursor includes a compound of a second target element, for forming the target material in combination with the first target element, and a second reaction element wherein the second target element reacts with the first target element deposited on the substrate to form the target material and the second reaction element forms a volatile reaction product.

2. The method according to claim 1, wherein the sacrificial material includes a sacrificial element acting as a co-reagent in a reaction with the precursor of the deposition process.

3. The method according to claim 1, wherein the precursor includes a compound of a target element, for forming the target material, and a reaction element, and the sacrificial material includes a sacrificial element acting as a co-reagent in a reaction with the precursor and forming a volatile reaction product with the reaction element wherein the target element is deposited on the substrate.

4. The method according to claim 1, wherein forming the feature of the sacrificial material on the substrate includes forming a sacrificial material layer on the substrate and patterning the sacrificial material layer using a lithography and etching process.

5. The method according to claim 1, wherein the feature of the sacrificial material includes at least one nanostructure.

6. The method according to claim 5, wherein the at least one nanostructure includes at least one nanowire extending along the substrate.

7. The method according to claim 1, wherein the feature of the sacrificial material is formed on a buffer layer of the substrate which is inert to the precursor(s) of the deposition process.

8. The method according to claim 1, wherein the sacrificial layer includes Si, Al, Ti, TiN, Hf, Sn, Zr, or Ta.

9. The method according to claim 1, wherein the deposition process includes a precursor including a transition metal source.

10. The method according to claim 1, wherein the deposition process includes a first precursor including a transition metal source and a second precursor including a chalcogen source.

11. The method according to claim 1, wherein the feature of the sacrificial material is formed on a layer of $Al_2O_3$, a layer of $SiO_2$, a layer of $Si_3N_4$, a transition dichalcogenide layer, a graphene layer or a metal layer.

12. The method according to claim 1, wherein at least one discrete sacrificial material feature is formed on the substrate, wherein each of the at least one sacrificial material feature, during the deposition process, is replaced by a respective feature of the target material, wherein the target material includes one or more monolayers of a transition metal dichalcogenide material, the method further comprising:
   subsequent to the deposition process, depositing the transition metal dichalcogenide material on an edge portion of each feature of the target material by performing a lateral deposition process wherein a lateral dimension of each feature of the target material is increased.

13. The method according to claim 12, wherein the deposition process forming the target material includes a first precursor including a transition metal source and a second precursor including a chalcogen source.

14. The method according to claim 12, wherein the feature of the sacrificial material is formed on a template layer of the substrate.

15. The method according to claim 12, wherein subsequent to the lateral deposition process, the method further comprising depositing an additional transition metal dichalcogenide material on an edge portion of the feature of the target material by performing an additional lateral deposition process.

16. The method according to claim 1, wherein at least one discrete sacrificial material feature is formed on the substrate, the method further comprising:

forming a set of mask portions on the substrate which are mutually separated such that a trench is formed between each pair of adjacent mask portions and each of the least one discrete sacrificial features is formed in a respective trench, wherein during the deposition process each discrete sacrificial material feature is replaced by a respective feature of the target material, wherein the target material includes one or more monolayers of a transition metal dichalcogenide, and the method further comprising:

subsequent to the deposition process, depositing an additional transition metal dichalcogenide on an edge portion of each of the at least one feature of the target material by performing a lateral deposition process.

17. The method according to claim 16, wherein the deposition process forming the target material includes a first precursor including a transition metal source and a second precursor including a chalcogen source.

18. The method according to claim 1, wherein at least one sacrificial material feature is formed as a nanowire on the substrate wherein each of the at least one sacrificial material features, during the deposition process, is replaced by a respective feature of the target material, and the method further comprising:

forming a support feature on the substrate, the support feature being formed to support at least one of the features of the target material; and subsequent to forming the at least one feature of the target material, removing material underlying the at least one feature of the target material wherein the at least one feature of the target material becomes suspended above a surface of the substrate by the support feature.

19. The method according to claim 18, wherein the support feature is formed prior to forming the target material.

* * * * *